United States Patent [19]

Chen

[11] Patent Number: 4,578,791
[45] Date of Patent: Mar. 25, 1986

[54] HIGH-POWER INJECTION LASER DIODE STRUCTURE

[75] Inventor: Bor-Uei Chen, Los Angeles, Calif.

[73] Assignee: TRW Inc., Redondo Beach, Calif.

[21] Appl. No.: 450,831

[22] Filed: Dec. 20, 1982

[51] Int. Cl.$^4$ ................................................ H01S 3/05
[52] U.S. Cl. .................................. 372/50; 350/96.16; 372/92; 372/98; 372/108
[58] Field of Search ..................... 372/44, 50, 92, 97, 372/98, 108, 45, 46; 350/96.16, 96.15

[56] References Cited

U.S. PATENT DOCUMENTS 4,461,007  7/1984  Burnham et al. ................. 372/45
4,479,224  10/1984  Rediker ........................... 372/92

Primary Examiner—James W. Davie
Attorney, Agent, or Firm—Noel F. Heal; Robert M. Wallace

[57] ABSTRACT

A semiconductor laser device having an array of injection laser diodes with laser cavities coupled to respective inputs of an optical star coupler. The star coupler functions both as a power combiner, to provide a single high-power output, an as a device to couple the laser cavities into a single integrated lasing region, for improved coherence and divergence properties and practically no wavefront distortion.

3 Claims, 1 Drawing Figure

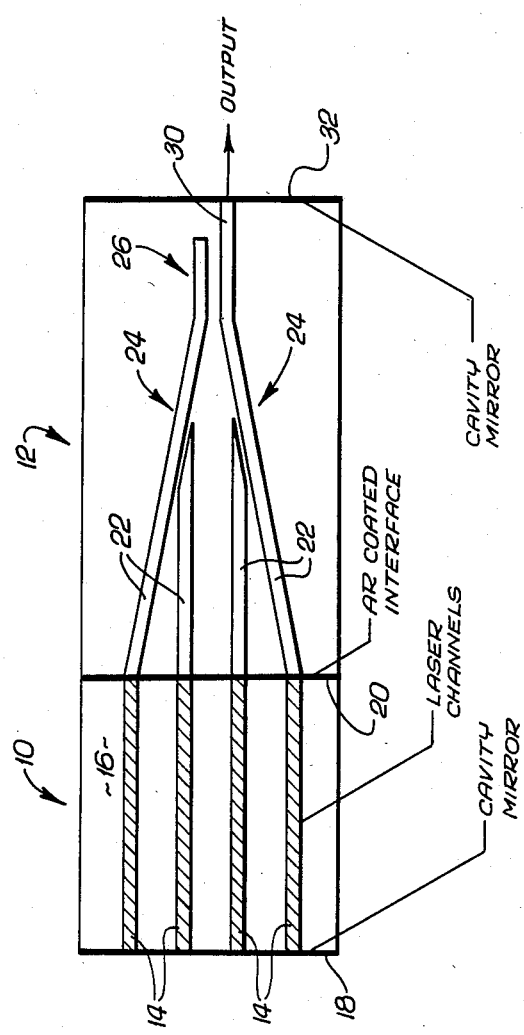

HIGH-POWER INJECTION LASER DIODE STRUCTURE

BACKGROUND OF THE INVENTION

The present invention relates generally to guided wave optics, and, more particularly, to relatively high-power laser light sources for applications such as optical communication systems. For most types of optical communication systems it is advantageous to employ a laser light source of high power output. For a given distance of transmission, a higher power will result in a higher signal-to-noise ratio at the receiving end. Likewise, for a given signal-to-noise ratio at the receiving end, a higher power will result in a longer transmission distance. Semiconductor injection lasers are frequently chosen as the light sources in optical communication systems, principally because of their small size and reliability.

In a semiconductor injection laser, a forward voltage bias is applied across a p-n semiconductor junction and minority current carriers are injected across the junction. Initially, at low current, there is spontaneous emission of photons in all directions in an active region of the junction. As the current increases, a threshold is reached at which stimulated emission occurs and a monochromatic, highly directional light beam is emitted from the active region. The active region is bounded at opposite ends by cleaved crystal facets, which serve as laser mirrors, and by roughened side surfaces to prevent emission in lateral directions. The power output of such a laser is limited by two factors. First, there is an upper threshold of power density beyond which there will be catastrophic damage or degradation of the laser performance, principally due to either the pitting of the crystal facets serving as laser mirrors or the formation of dark line defects. Power is also limited by the finite cross section of the active region of the laser.

By using a relatively large laser cavity, one can obtain a laser output of approximately 60 milliwatts (mW) for continuous wave (CW) operation at room temperature. While further improvements may be feasible, it is not expected that semiconductor lasers will be able to provide outputs in excess of 100 mW. Coupled laser arrays have recently achieved considerably higher output powers, by the use of waveguide coupling of laser cavities. However, the combined output of such an array has a relatively large aspect ratio, at least in its near-field pattern, and special lens systems are needed to provide a circular field pattern. Moreover, if the degree of coupling between the laser cavities is not strong enough, the phase front of the combined outputs will not be planar. This phase front distortion may not be a problem in a multimode fiber communication system, but would result in a lower useful power in some optical communication systems, such as single-mode fiber systems and optical space communications.

A coupled array of semiconductor lasers is shown in U.S. Pat. No. 4,255,717, issued to Scifres et al. A number of spatially displaced laser cavities are coupled together by any of a variety of disclosed techniques, apparently for purposes of increased power output, and improved coherence and divergence of the emitted light pattern. In all of the disclosed embodiments, however, the output is in the form of an array. There is no improvement in output power density. In addition, no consideration is given in the patent to producing a single output of circular cross section.

U.S. Pat. No. 4,309,667 issued to Di Forte et al. and U.S. Pat. No. 4,318,158 issued to Mito et al. also disclose coupled laser arrays. However, in both instances the arrays are coupled for purposes of combining laser outputs of different frequencies, in wavelength-division multiplexing systems.

It will be apparent from the foregoing and from a review of the prior art discussed above, that there has been a need in the guided wave optics field for a semiconductor laser structure that is capable of producing a single, coherent, high-power beam with low divergence and no wave-front distortion. The present invention satisfies this need.

SUMMARY OF THE INVENTION

The present invention resides in a laser device in which the outputs of a plurality of laser cavities are combined in a structure that also serves to couple the laser cavities together for improved coherence and divergence properties. Briefly, and in general terms, the invention comprises a semiconductor substrate, a plurality of semiconductor injection laser diodes having laser cavities formed in a spaced relationship on the substrate, and an optical star coupler having a single output and a plurality of inputs coupled to receive the respective outputs of the laser diodes. Both the lasing medium and star coupler are placed within the laser cavity The optical star coupler serves both to combine the outputs of the laser diodes and to couple the laser cavities together for improved coherence and divergence properties, providing a single output with a near-circular cross section and a practically planar wavefront.

In its function to couple the laser cavities, the star coupler includes a cavity mirror at its output end, effectively extending the length of each cavity, and integrating the several laser cavities into a single lasing structure. The lengths of all laser cavities are designed to be equal. The star coupler also acts in a conventional manner as a coherent power combiner, providing a single high-power output.

Although the star coupler may be of any suitable design, the one used in the embodiment shown herein by way of illustration employs a plurality of waveguides converging at coupling regions where two or more of the waveguides meet in non-parallel configurations. This arrangement minimizes losses due to bends in the coupler and avoids the use of Y-shaped sections. The star coupler is fabricated separately from the laser substrate and butted against the substrate, with the coupler input waveguides confined to match the spacing of the laser cavities. The waveguide material shall be able to sustain the high power density at the output end.

It will be appreciated from the foregoing that the present invention represents a significant step forward in the field of semiconductor lasers for communications systems and other applications. In particular, the invention provides high-power semiconductor laser device with improved coherence and divergence properties and without significant wavefront distortion. Other aspects and advantages of the invention will become apparent from the following more detailed description, taken in conjunction with the accompanying drawing.

BRIEF DESCRIPTION OF THE DRAWING

FIG. 1 is a simplified plan view of a semi-conductor laer device embodying the present invention.

DESCRIPTION OF THE PREFERRED EMBODIMENT

As shown in the drawing for purposes of illustration, the present invention is principally concerned with semiconductor lasers. Injection laser diodes are the most commonly used semiconductor lasers for such applications as optical communications. High power output is, of course, desirable, but is limited by the size and physical behavior of the devices. Accordingly, there has been a need for a semiconductor laser device of relatively high power output and with good coherence and divergence properties, as well as minimal wavefront distortion.

In accordance with the invention, an array of semiconductor lasers, indicated generally by reference numeral 10, is combined with an optical star coupler 12, which serves both to combine the power outputs of the lasers, and to couple the laser cavities, indicated at 14, into a single integrated laser structure. The lasers 10 are injection laser diodes of conventional design. The active regions forming the laser cavities are arranged in a spaced relationship on a single semiconductor substrate 16, and in the illustrated embodiment are shown as being parallel.

In the embodiment illustrated, the laser structure 10 is fabricated separately from the star coupler 12, and includes a reflective coating serving as a cavity mirror 18 at its end opposite the coupler 12. The other end 20, in contact with the star coupler 12, is coated with an antireflective material to permit the laser light to be emitted from the cavities. The star coupler includes a plurality of input waveguides 22 spaced to correspond in position with the ends of the laser cavities 14. The input waveguides 22 converge in pairs in a non-parallel fashion at coupling regions, indicated at 24. The structure shown by way of example has four input waveguides, which converge to form two intermediate waveguides, these in turn converging at a conventional parallel coupling region 26, to provide a single output waveguide 30. The output waveguide 30 passes through a mirrored surface 32, which serves as the other laser cavity mirror. In effect, the star coupler 12 and the laser cavities 14 together form a single integrated laser cavity, and the outputs of the lasers 10 are combined into a single high-power output at the output waveguide 30. One important requirement is that the path lengths for each of the laser cavities 14 should be the same, measured from the mirrored surface in the laser structure to the mirrored surface 32 through which output light passes from the coupler.

It will be appreciated from the foregoing that this structure ensures a very close coupling between lasing regions, and results in not only a high power output, but also good coherence and divergence properties, and low wavefront distortion in the output light from the device. It will also be appreciated that, although a specific embodiment of the invention has been described in detail for purposes of illustration, various modifications may be made without departing from the spirit and scope of the invention. Accordingly, the invention is not to be limited except as by the appended claims.

I claim:

1. A semiconductor device comprising:

a semiconductor substrate;

a plurality of semiconductor junction laser diodes having laser cavities formed in a spaced relationship on said substrate;

an optical star coupler having a single output and a plurality of inputs coupled to receive the respective outputs of said laser diodes, said star coupler including a plurality of input waveguides that converge in pairs in a non-parallel fashion at coupling regions, a plurality of intermediate waveguides extending from coupling regions, and at least one additional coupling region to combine the intermediate waveguides into a single output waveguide;

wherein said optical star coupler serves both to combine the outputs of said laser diodes and to couple said laser cavities together for improved coherence and divergence properties, providing a single output with a near-circular cross section and a practically planar wavefront;

and wherein said laser cavities are mirrored at one end only and said star coupler is mirrored at its output end to provide an integrated laser chamber including said laser cavities and said star coupler, and the path lengths measured from the mirrored end of each laser cavity to the mirrored end of the star coupler output, are approximately the same.

2. A semiconductor laser device as set forth in claim 1, wherein:

said star coupler is fabricated separately from said laser substrate.

3. A semiconductor laser device as set forth in claim 1, wherein:

said laser cavities are parallel with each other.

* * * * *